United States Patent
Dai et al.

(10) Patent No.: US 10,483,214 B2
(45) Date of Patent: Nov. 19, 2019

(54) OVERLAY STRUCTURES

(71) Applicant: GLOBALFOUNDRIES INC., Grand Cayman (KY)

(72) Inventors: Xintuo Dai, Rexford, NY (US); Dongsuk Park, Mechanicsville, NY (US); Guoxiang Ning, Clifton Park, NY (US); Mert Karakoy, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/860,775

(22) Filed: Jan. 3, 2018

(65) Prior Publication Data
US 2019/0206802 A1 Jul. 4, 2019

(51) Int. Cl.
*H01L 23/544* (2006.01)
*H01L 21/66* (2006.01)
*G03F 7/20* (2006.01)

(52) U.S. Cl.
CPC ........ *H01L 23/544* (2013.01); *G03F 7/70633* (2013.01); *H01L 22/12* (2013.01); *H01L 2223/54426* (2013.01); *H01L 2223/54466* (2013.01)

(58) Field of Classification Search
CPC ............................. H01L 23/544; G03F 7/70633
See application file for complete search history.

(56) References Cited

U.S. PATENT DOCUMENTS

| | | |
|---|---|---|
| 5,401,972 A | 3/1995 | Talbot et al. |
| 6,392,229 B1 | 5/2002 | Dana et al. |
| 7,080,330 B1 | 7/2006 | Choo et al. |
| 7,440,105 B2 | 10/2008 | Adel et al. |
| 8,041,103 B2 | 10/2011 | Kulkarni et al. |
| 8,187,773 B2 | 5/2012 | Nakajima et al. |
| 9,846,359 B1 | 12/2017 | Oh et al. |
| 2003/0223630 A1 | 12/2003 | Adel et al. |

(Continued)

FOREIGN PATENT DOCUMENTS

| | | |
|---|---|---|
| CN | 100350326 | 11/2007 |
| CN | 101046625 | 11/2013 |

(Continued)

OTHER PUBLICATIONS

Taiwanese Office Action dated Mar. 4, 2019 in related TW Application No. 107110490, 10 pages.

(Continued)

*Primary Examiner* — Farun Lu
(74) *Attorney, Agent, or Firm* — Michael Le Strange; Andrew M. Calderon; Roberts Mlotkowski Safran Cole & Calderon, P.C.

(57) ABSTRACT

The present disclosure generally relates to semiconductor structures and, more particularly, to overlay structures and methods of manufacture. The method includes locating a first plurality of offset dummy features in a first layer; locating a second plurality of offset dummy features in a second layer; measuring a distance between the first plurality of offset dummy features and the second plurality of offset dummy features; and determining that the first layer or the second layer is shifted with respect to one another based on the measurement.

14 Claims, 8 Drawing Sheets

(56) References Cited

U.S. PATENT DOCUMENTS

| | | | |
|---|---|---|---|
| 2013/0286395 A1* | 10/2013 | Lee | G03F 7/70633 356/401 |
| 2014/0065736 A1 | 3/2014 | Amir et al. | |
| 2017/0090299 A1* | 3/2017 | Chen | G03F 7/70141 |

FOREIGN PATENT DOCUMENTS

| | | |
|---|---|---|
| JP | 2006518942 A | 8/2006 |
| JP | 201149285 | 3/2011 |
| JP | 20143088 | 1/2014 |
| TW | 201702730 | 1/2017 |
| TW | 201705212 | 2/2017 |
| TW | 201728991 | 8/2017 |

OTHER PUBLICATIONS

Taiwanese Notice of Allowance dated Jul. 31, 2019 in related TW Application No. 107110490, 4 pages.

\* cited by examiner

OVERLAY STRUCTURES

FIELD OF THE INVENTION

The present disclosure generally relates to semiconductor structures and, more particularly, to overlay structures and methods of manufacture.

BACKGROUND

As devices shrink, it is becoming more difficult to accurately overlay layers to meet device requirements. Overlay issues can arise from the shifting of layers, which can cause defects in the device. For example, the shifted layers will result in misaligned features throughout the layers. To adjust for these issues, measurements of the shift are desired to determine an amount of shift so that appropriate correction can occur.

Issues can also arise from the measuring of the shift, itself. As an example, measurement noise can result from discrepancies in the measurement technique being implemented. For example, measurement noise can occur because of discrepancies in an optical overlay measurement technique, which measures the shift by looking from a top layer down through to a bottom layer, i.e., in a y-axis. Process variation during fabrication can also cause measurement noise, resulting in further inaccurate measurements. In this way, measurement noise can significantly affect correction of the shift and have overlay errors.

SUMMARY

In an aspect of the disclosure, a method comprises: locating a first plurality of offset dummy features in a first layer; locating a second plurality of offset dummy features in a second layer; measuring a distance between the first plurality of offset dummy features and the second plurality of offset dummy features; and determining that the first layer or the second layer is shifted with respect to one another based on the measurement.

In an aspect of the disclosure, a method comprises: determining at least one layer out of a stack of layers is shifted; measuring a distance between dummy features located in the at least one layer; and verifying that the at least one layer is shifted based on the measurement.

In an aspect of the disclosure, a structure comprises: a first plurality of offset dummy features in a first layer; and a second plurality of offset dummy features in a second layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to overlay structures and methods of manufacture. In embodiments, the structures and processes described herein allow for an accurate overlaying of layers in a build structure. By having the overlay layers accurately arranged, the features throughout the different layers are aligned with respect to one another, thereby preventing defects.

In semiconductor fabrication processes, shifting can occur during the laying of different layers of the structure. The amount of shift and which layers are shifted needs to be determined to prevent defects in the structure. To address these issues, the structures and processes described herein implement dummy features in each layer of the build structure to determine a shift of layers. In embodiments, when a shift is determined, the processes described herein can determine which layers are causing the shift, i.e., which layers have been shifted in the build structure.

For example, in embodiments, a dummy feature is set at a specific shift value, while another dummy feature in a different layer is set to another specific shift value. In this way, each dummy feature can be utilized as a reference point to determine shifting in the overlaying of layers. A measurement technique, e.g., a scanning electron microscope overlay (SEM-OVL) technique, is implemented to measure an offset between the dummy features in the different layers. In embodiments, the measurement is based on a specific calibration factor, e.g., kpf, to calculate an offset between the dummy features to determine if a shift has occurred. In implementing the processes described herein, a determination can be made as to whether any layers have shifted, based on the measurement and subsequent calculation.

In embodiments, a measurement is performed in each layer which is suspected of being shifted. Specifically, the dummy features of the suspected shifted layer are measured with respect to one another. This measurement is then compared to an expected value to determine if a shift is present in that specific layer which is being measured. For example, in embodiments, if the measurement equals an expected value, a determination is made that there is no shifting of layers. Alternatively, if the measurement does not equal the expected value, a determination is made that at least one of the layers has shifted. Once a determination is made that a shift is present, a user can determine which layers are suspected of being shifted because of the comparison of the calculation to the expected value. In this way, the structures and processes described herein allow for a determination of a shift and which specific layers are causing the shift, so that appropriate correction can be implemented.

Figure 1A:
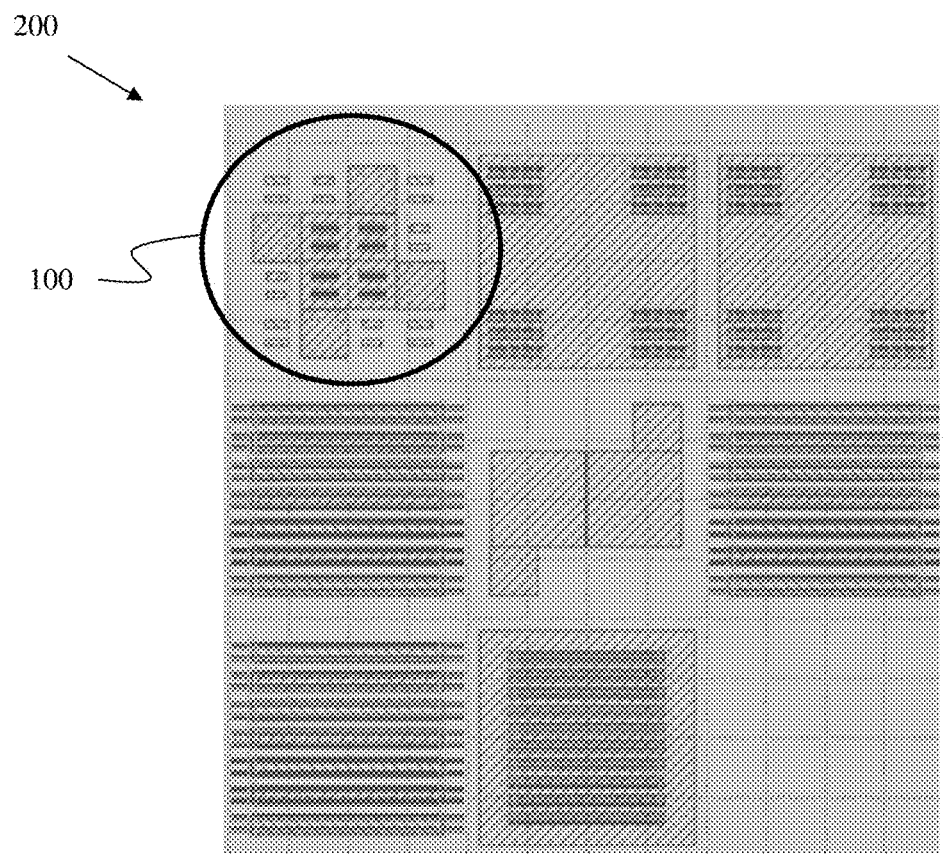
FIGS. 1A and 1B show a structure, amongst other features, and respective fabrication processes in accordance with aspects of the present disclosure.
Figure 1B:
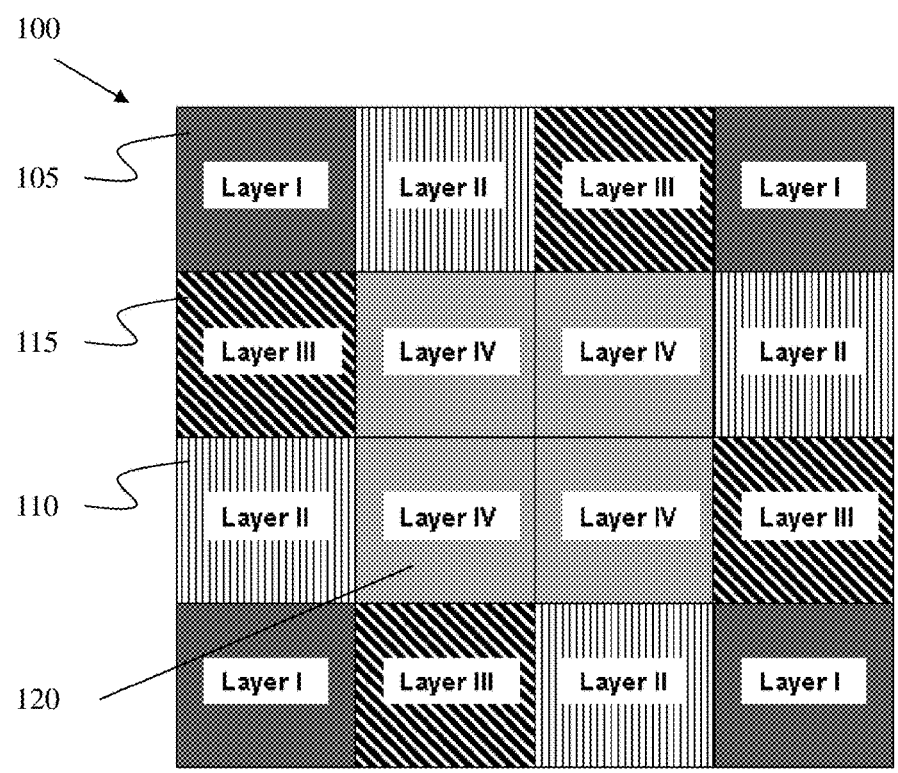

FIGS. 1A and 1B illustrate a structure 200 comprised of stacked layers 105, 110, 115, 120. Although four layers are described herein, it should be understood by those of ordinary skill in the art that any number of layers can be analyzed for shift in overlay structures in accordance with the processes described herein. The structure 200 represents a chip or an intra-field on a wafer, with section 100 representing a section of the chip. In embodiments, the structure 200 can have dimensions of up to 26 mm×33 mm, while the section 100 can have dimensions of 6 μm×12 μm; although other dimensions are contemplated herein. The layers 105, 110, 115, 120 can each have various features. As an example, the first layer 105 and the third layer 115 can be comprised of wiring structures, while the second layer 110 and the fourth layer 120 are comprised of gate structures, for example. Ideally, the features of the first layer 105, the second layer 110, the third layer 115 and the fourth layer 120 should be aligned with respect to one another so that the structure 200 is operational.

During fabrication of the structure 200, various steps are implemented to form the features of the respective layer. For example, the second layer 110 may be patterned and doped to form source and drain regions for a respective gate structure. However, doing fabrication processes may cause the second layer 110 to shift, thereby preventing the features in the second layer 110 to be aligned with the features of the first layer 105, and also any features in subsequent layers over the second layer 110, i.e., the third layer 115 and the fourth layer 120. Accordingly, a shift in the overlaying of layers 105, 110, 115, 120 needs to be determined.

Figure 2:
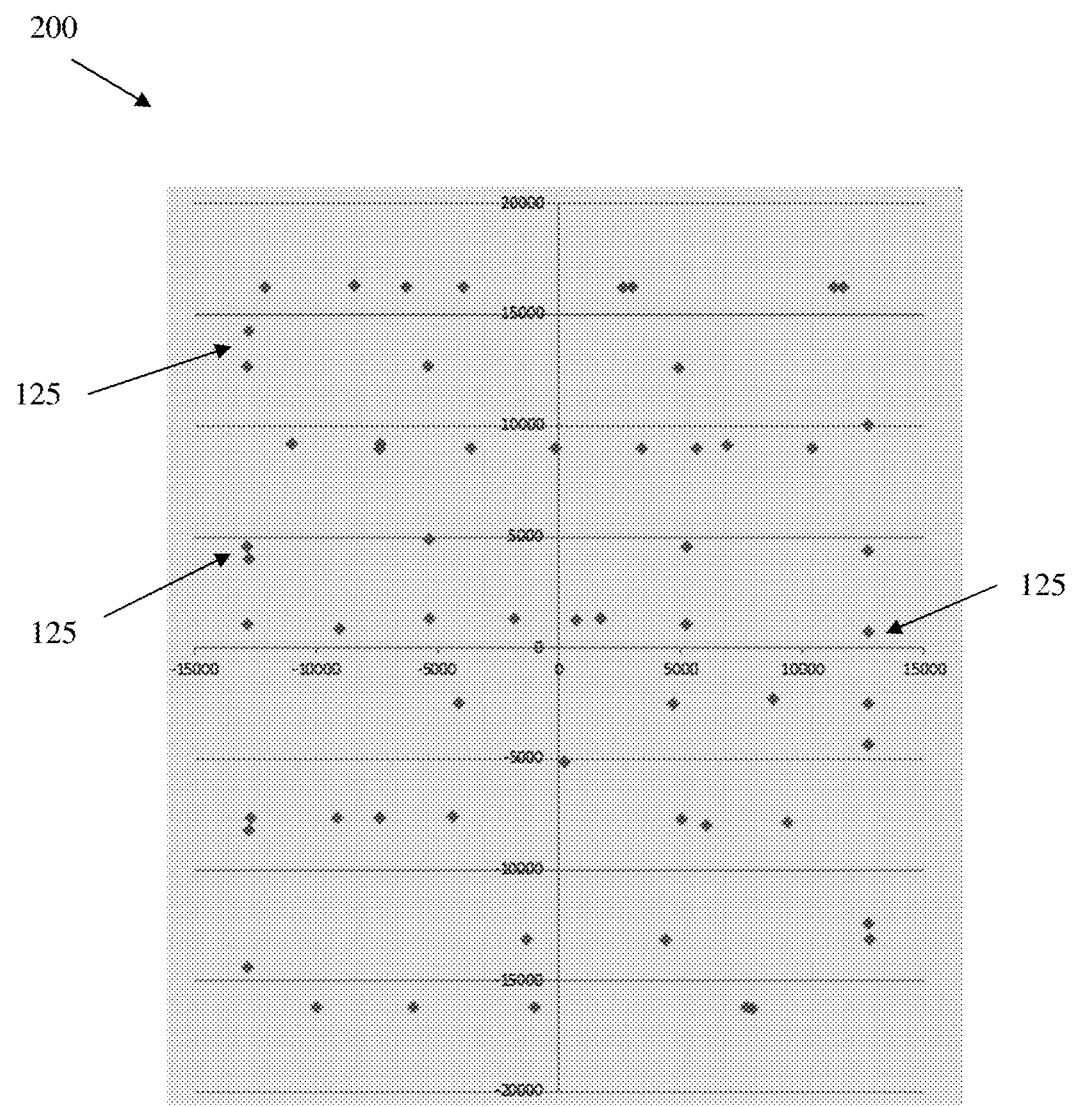
FIG. 2 shows dummy features, amongst other features, and respective fabrication processes in accordance with aspects of the present disclosure.

FIG. 2 illustrates the structure 200 with multiple dummy features 125 implemented within each layer, i.e., the first layer 105, the second layer 110, the third layer 115 and the fourth layer 120. In embodiments, the dummy features 125 can be various structures which are visible through the stacked layers 105, 110, 115, 120. For example, the dummy features 125 can be dummy interconnect structures extending through the layers 105, 110, 115, 120, amongst other examples. In embodiments, the dummy features 125 are implemented in unused space of each layer. For example, the dummy features 125 can be implemented in unused space between wiring structures, amongst other examples. In a preferred implementation, the dummy features 125 should be protected such that they will not be damaged during a dicing process. As shown in FIG. 2, multiple dummy features 125 can be present in the structure 200. For example, a total of 59 dummy features 125 can be implemented in the structure 200, amongst other examples.

Figure 3A:
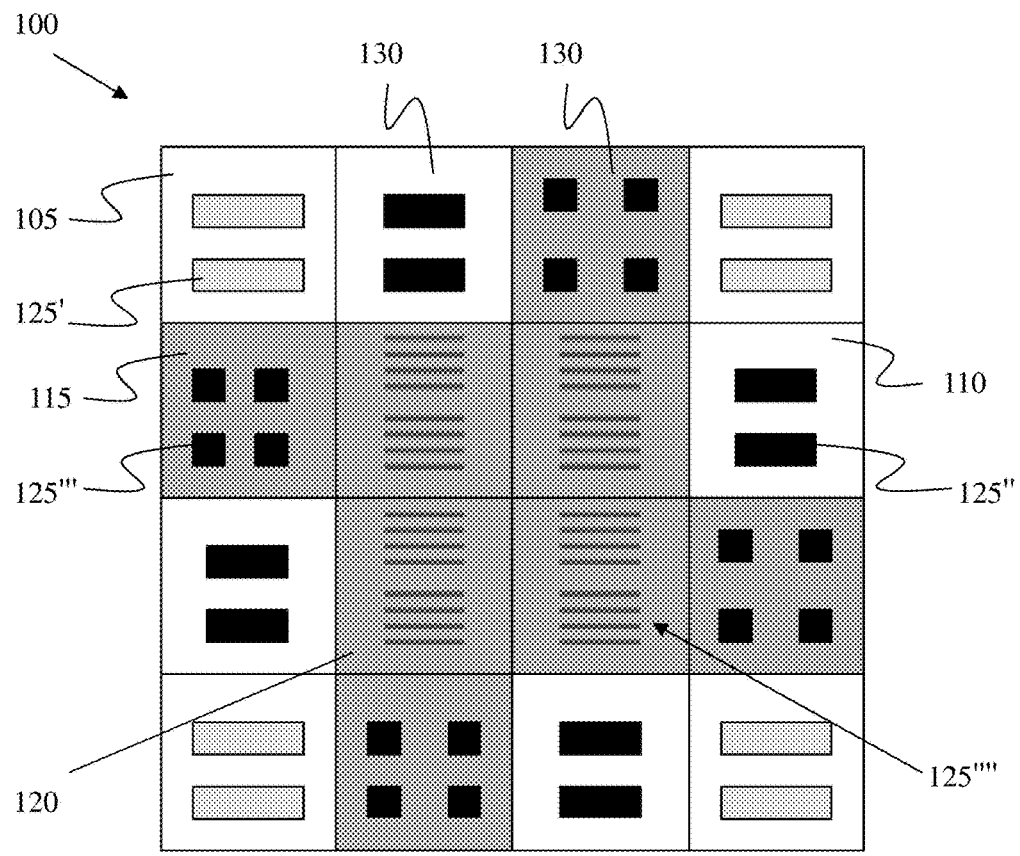
FIGS. 3A-3C show dummy features and their respective offsets, amongst other features, and respective fabrication processes in accordance with aspects of the present disclosure.
Figure 3B:
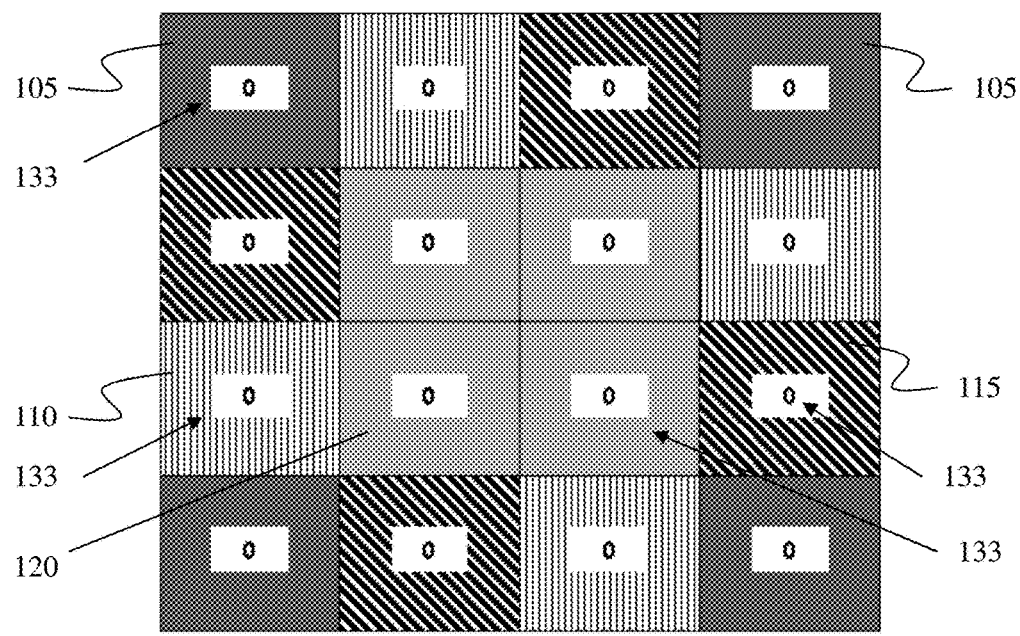
Figure 3C:
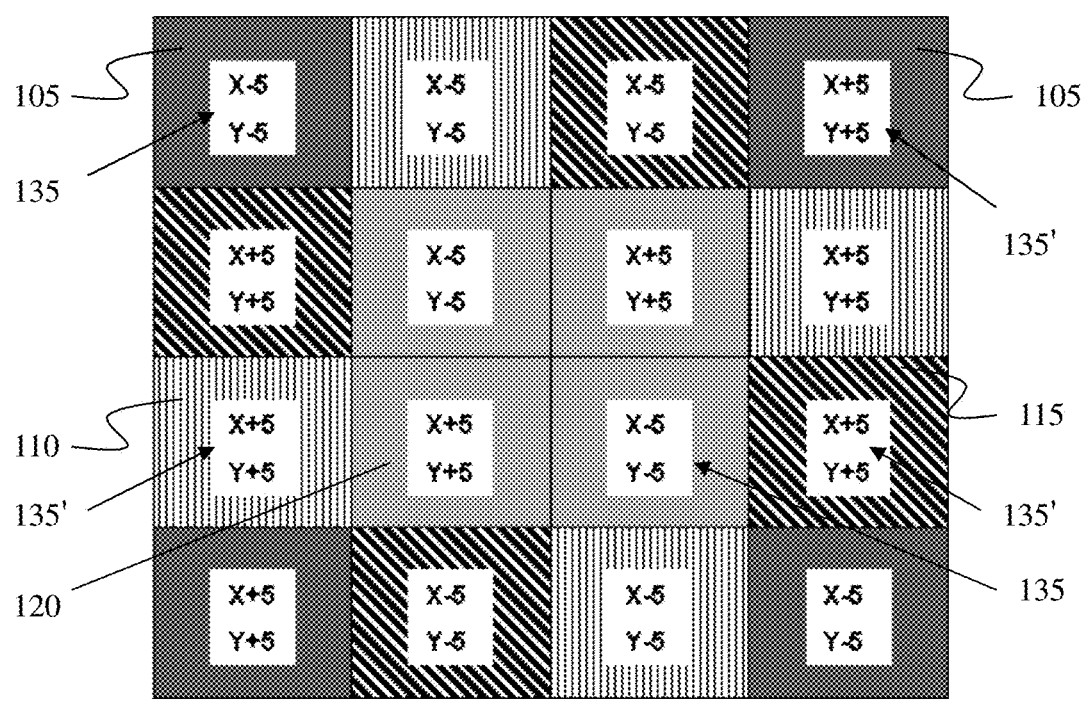

FIGS. 3A-3C illustrate various dummy features 125 and their respective offsets during in-die self-calibration overlay. As shown in FIG. 3A, the first layer 105 contains the dummy features 125', the second layer 110 contains the dummy features 125", the third layer 115 contains the dummy features 125''' and the fourth layer 120 contains the dummy features 125''''. The dummy features 125', 125", 125''', 125'''' are provided in each layer 105, 110, 115, 120 to serve as reference points for the respective layers they are implemented within. In embodiments, the dummy features 125', 125", 125''', 125'''' can be implemented in unused space 130 in the stacked layers 105, 110, 115, 120. Examples of unused space 130 include a space between wiring structures, amongst other examples. In other embodiments, the dummy features 125', 125", 125''', 125'''' can be dummy interconnect structures in the unused space 130 in at least one layer of the layers 105, 110, 115, 120 or in all of the layers 105, 110, 115, 120. In this way, the unused space 130 can maintain the integrity of the dummy features 125', 125", 125''', 125'''' in the layers 105, 110, 115, 120. As an example, the unused space 130 in the first layer 105 and the unused space 130 in the second layer 110 maintains the integrity of the first plurality of offset dummy features 125' and the second plurality of offset dummy features 125" during a dicing process.

As shown in FIG. 3B, the dummy features are at an initial offset 133 of 0 nm because in-die self-calibration has not occurred, i.e., the layers 105, 110, 115, 120 have not been offset. FIG. 3C illustrates in-die self-calibration by having the dummy features 125', 125", 125''', 125'''' now set to a negative offset 135 and a positive offset 135'. Specifically, each layer 105, 110, 115, 120 is offset in known values so that the negative offset 135 and the positive offset 135' are set with respect to an x-direction and a y-direction in values of μm and/or nm, amongst other examples.

As shown in FIG. 3C, the negative offset 135 can be set to −5 nm in the x-direction and −5 nm in the y-direction. For example, as shown in FIG. 3C, the negative offset 135 for the first layer 105 represents that the first layer 105 has been offset by known values resulting in the dummy features 125' in this part of the first layer 105 being offset to specific values of −5 nm in both the x and y directions. On the other hand, the positive offset 135' can be set to +5 nm in the x-direction and a +5 nm in the y-direction. For example, the positive offset 135' for the first layer 105 represents that the first layer 105 has been offset by known values resulting in the dummy features 125' in this part of the first layer 105 being offset to specific values of +5 nm in both the x and y directions. It should be understood that other predetermined offset values are contemplated herein. In this way, the dummy features 125', 125", 125''', 125'''' can be used as reference points for determining if a shift is present in the layers 105, 110, 115, 120 since the values of offset are known and set by the user, i.e., in-die self-calibration. That is, the dummy features 125', 125", 125''', 125'''' can be offset in the x-direction by known values, and can also be offset in the y-direction by known values, so that the dummy features 125', 125", 125''', 125'''' can serve as reference points. Further, the in-die self-calibration eliminates any process noise, variation or tool noise found in overlay measurement techniques because the offset values are known and set by the user, thereby eliminating unwanted variation.

In embodiments, the values in the negative offset 135 and the positive offset 135' can be set to any value that can be used as a reference point for in-die self-calibration. For example, each layer 105, 110, 115, 120 can be offset so that the negative offset 135 can be set to −3 nm in the x-direction and −7 nm in the y-direction, while the positive offset 135' can be set to +3 nm in the x-direction and +7 nm in the y-direction, amongst other possible combinations. In embodiments, each dummy feature of the dummy features 125', 125", 125''', 125'''' is set to a negative offset 135 and a positive offset 135'. In this way, the first layer 105 is offset so that the dummy feature 125' of the first layer 105 is set to both the negative offset 135 and the positive offset 135', the second layer 110 is offset so that the dummy feature 125" of the second layer 110 is set to both the negative offset 135 and the positive offset 135', the third layer 115 is offset so that the dummy feature 125''' of the third layer 115 is set to both the negative offset 135 and the positive offset 135', and the fourth layer 120 is offset so that the dummy feature 125'''' of the fourth layer 120 is set to both the negative offset 135 and the positive offset 135'.

Figure 4A:
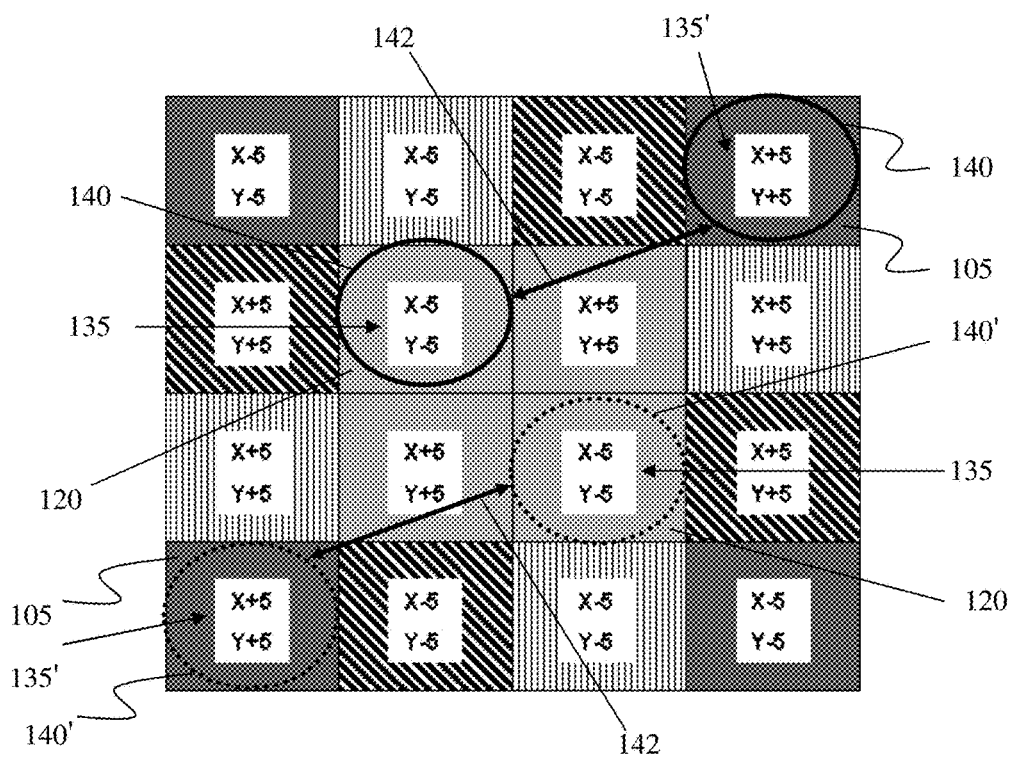
FIGS. 4A-4C show offset measurements, amongst other features, and respective fabrication processes in accordance with aspects of the present disclosure.
Figure 4B:
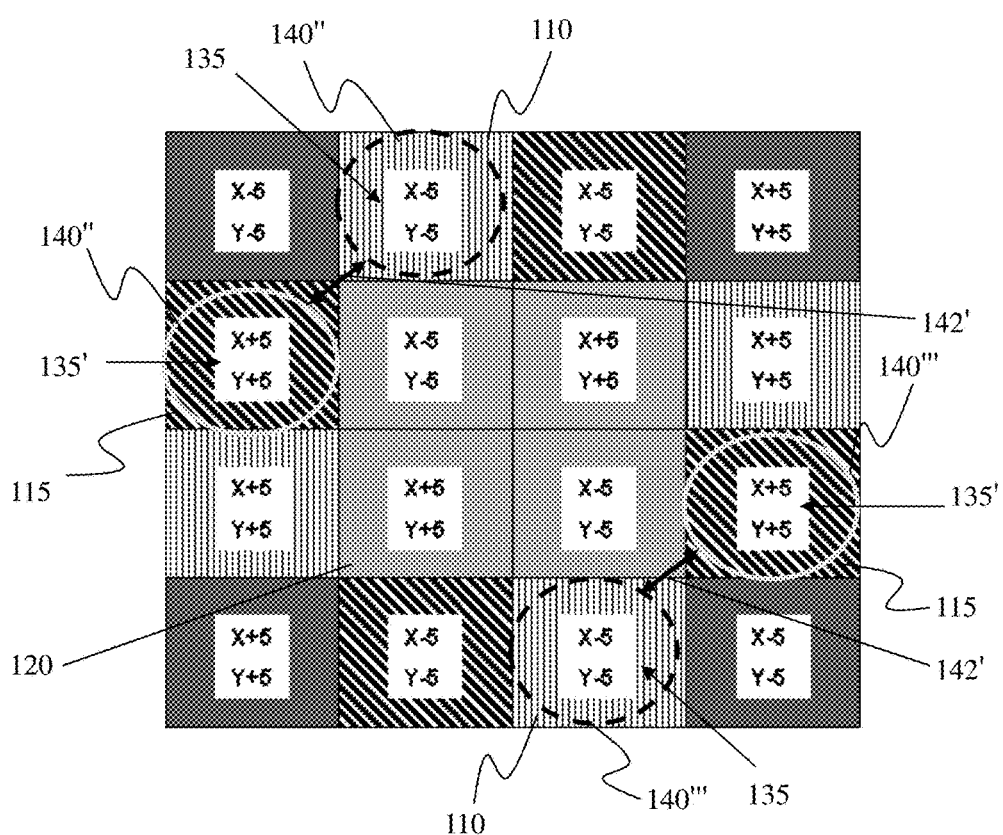
Figure 4C:
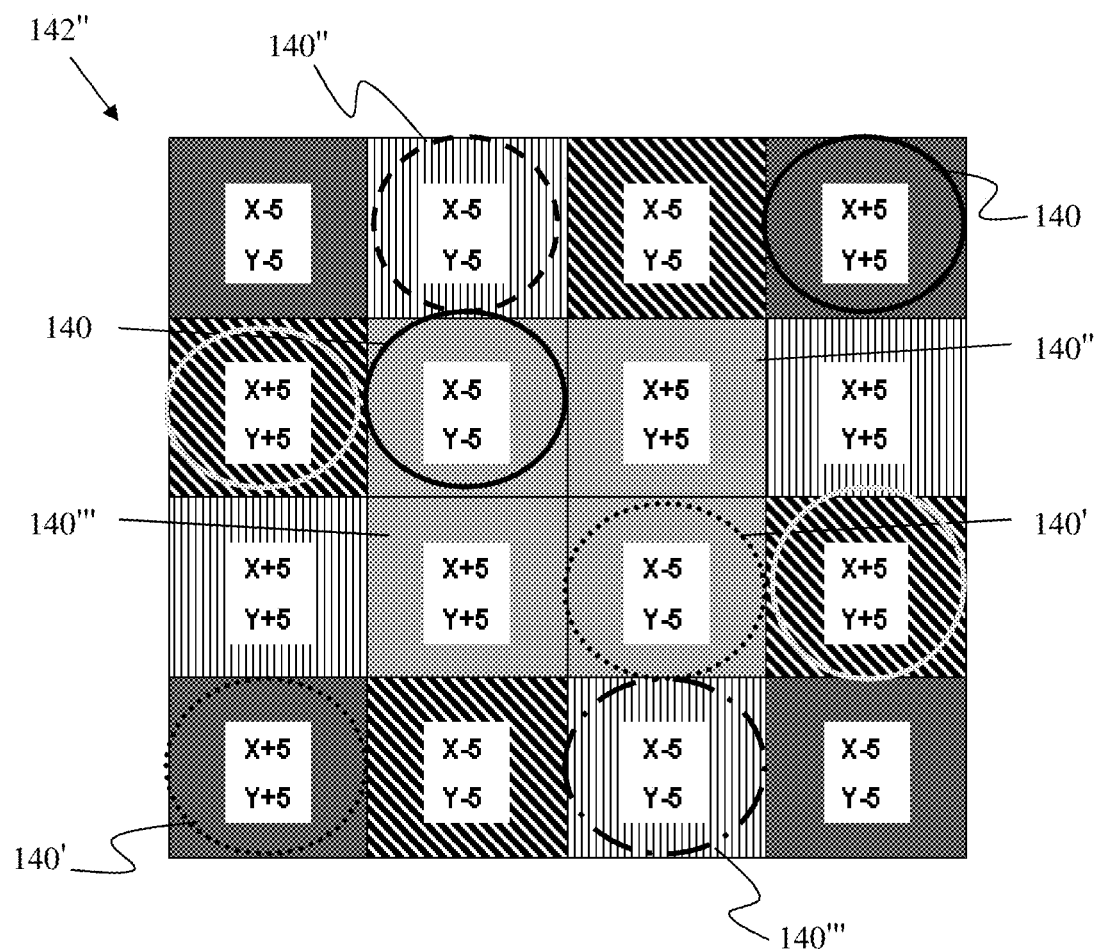

FIGS. 4A-4C illustrate the determination of any undesired overlay shifting in the layers 105, 110, 115, 120 after in-die self-calibration. In embodiments, a first selection 140 and a second selection 140' compares the first layer 105 to the fourth layer 120 in order to determine if a shift is present. Specifically, the dummy features 125' in the first layer 105 are compared to the dummy features 125'''' of the fourth layer 120. In FIG. 4A, the first selection 140 and the second selection 140' comprise the first layer 105 set to a positive offset 135' and the fourth layer 120 set to a negative offset 135. Measurements 142 of the offset values is performed by a measurement technique, e.g., a scanning electron microscope overlay (SEMOVL) technique.

The SEMOVL technique provides benefits over other techniques because SEMOVL measures the offsets in an x-direction across a surface of the top layer, i.e., across a surface of the fourth layer 120. In this way, the measurements 142 and any subsequent measurements are performed by measuring the distance between the dummy features 125 across a surface of one of the layers 105, 110, 115, 120. The SEMOVL technique does not require measuring from the top layer, i.e., from the fourth layer 120, through the middle second and third layers 110, 115, and down to the bottom first layer 105, in a y-direction like in other measurement techniques, i.e., optical overlay techniques. These measurements 142 taken from the first selection 140 and the second selection 140' are assigned as variable "a" for calculating the presence of any undesired shifting in the layers 105, 110, 115, 120. Specifically, each measurement of the measurements 142 represents a distance between the dummy features, e.g., the distance between the offset dummy features 125' of the first layer 105 and the offset dummy features 125'''' of the fourth layer 120.

In FIG. 4B, additional measurements 142' of the offset dummy features 125 are taken. Specifically, a third selection 140'' and a fourth selection 140''' comprising the second layer 110 being set to a negative offset 135 and the third layer 115 being set to a positive offset 135'. Measurements 142' of the offsets between the dummy features 125'' of the second layer 110 and the dummy features 125''' of the third layer 115 are taken by the SEMOVL technique. Specifically, each measurement of the measurements 142' represents a distance between the dummy features, e.g., the distance between the offset dummy features 125'' of the second layer 110 and the offset dummy features 125''' of the third layer 115. These are set as a variable "b" for calculating the presence of any undesired shifting in the layers 105, 110, 115, 120. In embodiments, the first selection 140, the second selection 140', the third selection 140'' and fourth selection 140''' can compare any layers of the layers 105, 110, 115, 120 with respect to one another. For example, the first selection 140 can compare the first layer 105 with the third layer 115. In this way, the comparing of the layers 105, 110, 115, 120 is not limited to any specific combination.

As shown in FIG. 4C, all the selections, i.e., the first selection 140, the second selection 140', the third selection 140'' and the fourth selection 140''', are taken together to take measurements 142'' to find a variable "c" for calculating the presence of any undesired shifting in the layers 105, 110, 115, 120. The measurements 142, 142', 142'' are represented as variables "a", "b", "c" with their relationship to one another expressed by the following functions:

$$\frac{A}{a} = \frac{B}{b} = \frac{C}{c} = \frac{A-B}{a-b} \quad (1)$$

$$A = C + 10 \quad (2)$$

$$B = C - 10 \quad (3)$$

$$\frac{C}{c} = \frac{(C+10)-(C-10)}{a-b} = \frac{20}{a-b} \quad (4)$$

$$C = c \times \frac{20}{a-b} \quad (5)$$

In the above function, "C" equals a known offset value which represents no undesired overlay shift in the layers of the structure 200, i.e., no undesired overlay shifting in the layers 105, 110, 115, 120. Specifically, variable "C" equals zero undesired overlay shift, while variable "a" represents the measurements 142 taken from the first selection 140 and the second selection 140', and variable "A" equaling a known offset value for the measurements of the first selection 140 and the second selection 140'. Variable "b" represents the measurements 142' taken from the third selection 140'' and the fourth selection 140''', while "B" equals a known offset for the measurements of the third selection 140'' and the fourth selection 140'''. Variable c represents the measurements 142'' from all of the first selection 140, the second selection 140', the third selection 140'' and fourth selection 140'''. The numeral "10" in equations 2-4 represents the known offset value. For example, as shown in FIG. 4A, the first selection 140 and the second selection 140' have a known offset difference of 10 nm, since the first selection 140 is offset by −5 nm in the x-direction and −5 nm in the y-direction, and the second selection 140' is offset by +5 nm in the x-direction and +5 nm in the y-direction, which would equal an offset distance of 10 nm in the x-direction and offset distance of 10 nm in the y-direction between the first selection 140 and the second selection 140'.

The numeral "20" in equation 5 represents a calibration factor, e.g., kpf, set by the user. In this way, the presence of undesired overlay shift is determined by plugging in the measurements 142, 142', 142'' into the variables "a", "b", "c" to calculate an output value, and comparing the output value to "C". In embodiments, if the output value does not equal "C", then a determination can be made that an undesired overlay shift exists in the layers of the structure 200, i.e., that at least one of the layers 105, 110, 115, 120 is shifted. Alternatively, if the output value does equal "C," a determination can be made that an undesired shift is not present, i.e., that none of the layers 105, 110, 115, 120 are shifted. In this way, if C does not equal c, the structures and processes described herein allow a determination of whether a layer has actually shifted, or if it is a measurement error or noise causing c to not be equal to C.

By using SEMOVL techniques along with the in-die self-calibration, the structures and processes described herein provide a self-calibrated SEMOVL system for detecting shift. Specifically, in-die self-calibration by SEM overlay occurs by having dummy features 125', 125'', 125''', 125'''' in the layers 105, 110, 115, 120 serving as reference points with known offsets. Measurements are taken from the dummy features 125', 125'', 125''', 125'''' to obtain offset values present in the structure 200. The measured offset values are entered into specific functions to find a calculated overall offset of the structure 200. The calculated overall offset is compared to a known value to determine if an undesired overlay shift exists in the layers 105, 110, 115, 120. By having reference points with known values and comparing offset data to known values, the self-calibrated SEMOVL system provided herein is independent of process variation, and is also independent of systematic noise generated by tools in overlay measurement techniques. In this way, the structures and processes described herein provide the benefits of enabling in-die SEM-overlay for small sized devices, e.g., 7 nm and through quartz via (TQV), for example. Further, the structures and processes described herein provide the benefit of enabling accurate overlay measurements without any process variation or measurement noise.

Figure 5A:
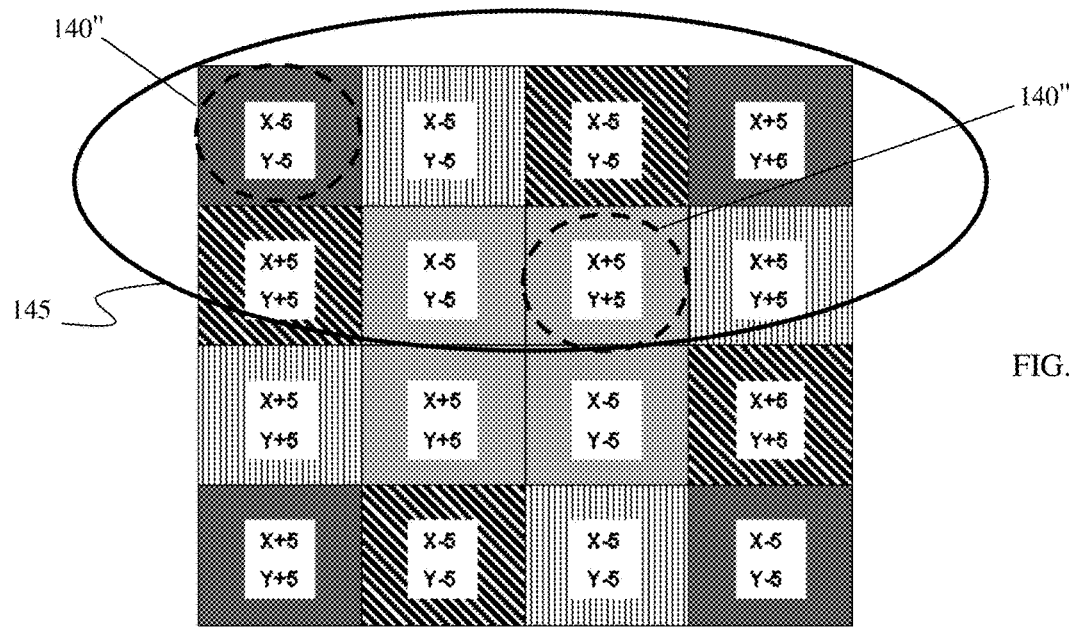
FIGS. 5A and 5B show measurements of the dummy features, amongst other features, and respective fabrication processes in accordance with aspects of the present disclosure.
Figure 5B:
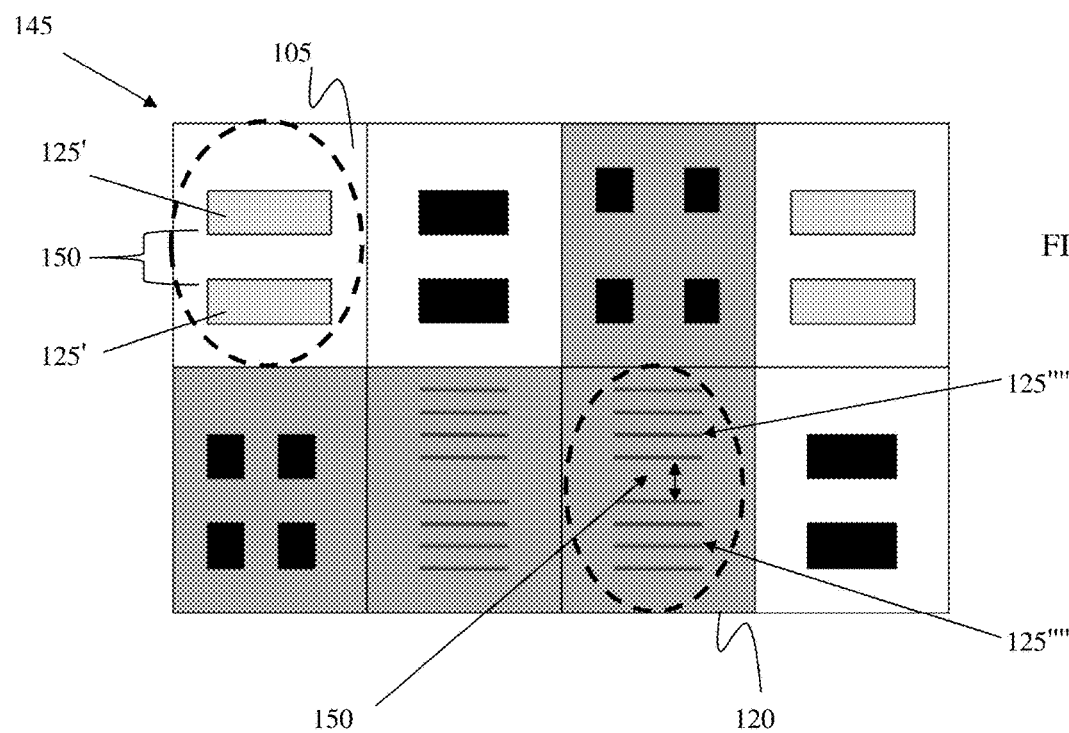

FIGS. 5A and 5B illustrate further processes to determine the specific layers which have shifted, i.e., when "c" does not equal "C." In this way, the structures and processes described herein allow for determining which layer(s) is causing the undesired shift, or, if upon verifying that no shift is present, determining that there was measurement error or noise which presented itself as unwanted shift. This allows a user to eliminate variation and overlay measurement tool systematic noise. Specifically, FIG. 5A illustrates a third selection 140″ which comprises the first layer 105 and the fourth layer 120. Upon determining that an undesired overlay shift exists, a section 145 is analyzed to determine which layer is responsible for the undesired overlay shift. For the first layer 105, the distance 150 between the dummy features 125' is taken to determine if a shift is present in the first layer 105. Specifically, a measurement of the distance 150 between the dummy features 125' is taken by a measurement technique, e.g., by an SEMOVL technique. This distance 150 is then compared to a known value. If the distance 150 is equal to the known value, there is no undesired shift present in the first layer 105. Alternatively, if the distance 150 does not equal the known value, there is a shift present in the first layer 105. In this way, the structures and processes described herein allow for verifying that the at least one layer of the layers 105, 110, 115, 120 is shifted based on the measurement of distance 150 by comparing the measurement of distance 150 to a known value.

The same measurement techniques are also applied to the other layer in the selection, in this example the fourth layer 120. If the distance 150 between the dummy features 125″″ is equal to the known value, there is no shift present in the fourth layer 120. Alternatively, if the distance 150 is not equal to the known value, a shift is present in the fourth layer 120. In this way, the structures and processes described herein allow for a determination of shift in the layers 105, 110, 115, 120, along with a determination of which layer of the layers 105, 110, 115, 120 is responsible for the shift. If, after all the suspected shifted layers have been analyzed and that a determination is made based on the further measurements that no layer is actually shifted, the user can make a determination that measurement error or noise presented itself as unwanted shift, and that no actual undesired shift exists.

As will be appreciated by one skilled in the art, processes described herein may be embodied as a system, method or computer program product. Accordingly, aspects of the present disclosure may take the form of an entirely hardware embodiment, an entirely software embodiment or an embodiment combining software and hardware aspects. Furthermore, aspects of the present disclosure may take the form of a computer program product embodied in one or more computer readable storage medium(s) having computer readable program code embodied thereon.

The computer readable storage medium (or media) having computer readable program instructions thereon causes one or more computing processors to carry out aspects of the present disclosure. The computer readable storage medium can retain and store instructions for use by an instruction execution device. The computer readable storage medium may be, for example, the following non-transitory signals: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. The computer readable storage medium is not to be construed as transitory signals per se; instead, the computer readable storage medium is a physical medium or device which stores the data. The computer readable program instructions may also be loaded onto a computer, for execution of the instructions, as shown in FIG. 6.

Figure 6:
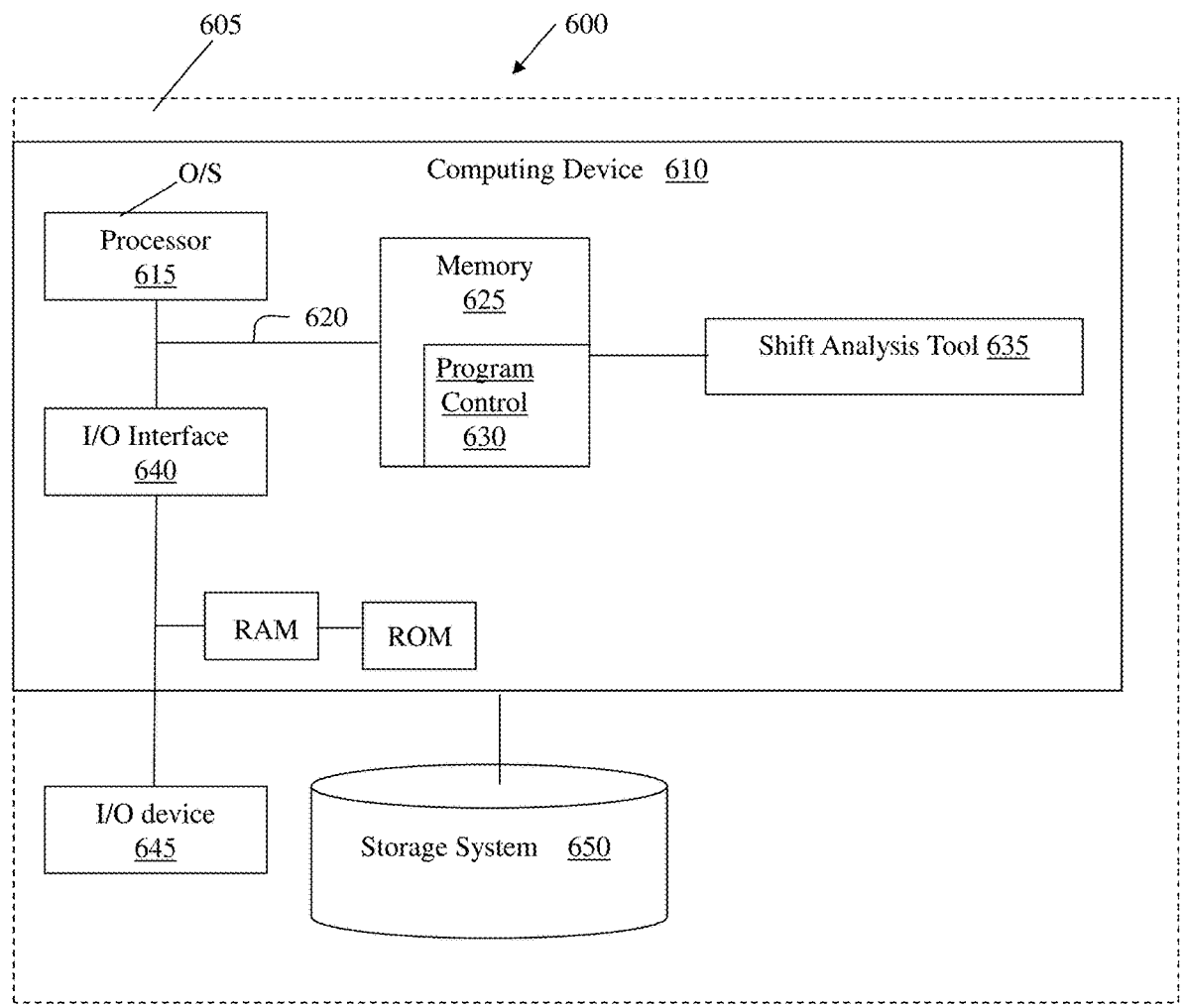
FIG. 6 shows an illustrative infrastructure for implementing offset measurements and analysis in accordance with aspects of the invention.

FIG. 6 shows a computer infrastructure 600 for implementing the steps in accordance with aspects of the disclosure. To this extent, the infrastructure 600 can implement the measurement and analysis processes as described herein to determine whether a shift is present in the layers of the structure 200. The infrastructure 600 includes a server 605 or other computing system that can perform the processes described herein. In particular, the server 605 includes a computing device 610. The computing device 610 can be resident on a network infrastructure or computing device of a third party service provider (any of which is generally represented in FIG. 6).

The computing device 610 includes a processor 615 (e.g., CPU), memory 625, an I/O interface 640, and a bus 620. The memory 625 can include local memory employed during actual execution of program code, bulk storage, and cache memories which provide temporary storage of at least some program code in order to reduce the number of times code which are retrieved from bulk storage during execution. In addition, the computing device includes random access memory (RAM), a read-only memory (ROM), and an operating system (O/S).

The computing device 610 is in communication with an external I/O device/resource 645 and a storage system 650. For example, the external I/O device/resource 645 can comprise any device that enables an individual to interact with computing device 610 (e.g., user interface) or any device that enables computing device 610 to communicate with one or more other computing devices using any type of communications link. The external I/O device/resource 645 may be for example, a handheld device, PDA, handset, keyboard etc.

In general, processor 615 executes computer program code (e.g., program control 530), which can be stored in memory 625 and/or storage system 650. Moreover, in accordance with aspects of the invention, program control 630 controls a shift analysis tool 635, which determines whether there is any undesired overlay shift in any of the layers 105, 110, 115, 120 of the structure 200. The shift analysis tool 635 can be implemented as one or more program codes in program control 630 stored in memory 625 as separate or combined modules. Additionally, the shift analysis tool 635 may be implemented as separate dedicated processors or a single or several processors to provide the function of this tool. While executing the computer program code, the processor 615 can read and/or write data to/from memory 625, storage system 650, and/or I/O interface 640. The program code executes the processes of the invention. The bus 620 provides a communications link between each of the components in computing device 610.

The shift analysis tool 635 is utilized to determine the presence of shift in a structure 200. In embodiments, the shift analysis tool 635 can be the SEMOVL tool, and will take offset measurements from the dummy features 125 in the structure 200, i.e., the dummy features 125' of the first layer 105, the dummy features 125″ of the second layer 110, the dummy features 125‴ of the third layer 115, and the dummy features 125'''' of the fourth layer 120. The offset measurement begins with the shift analysis tool 635 physically offsetting the layers 105, 110, 115, 120 so that the dummy features 125', 125'', 125''', 125'''' are offset into the negative offset 135 and the positive offset 135'. As an example, the shift analysis tool 635 can physically offset the first layer 105 so that some of the dummy features 125' can be offset −5 nm in both the x-direction and y-direction, and while other dummy features 125' are offset as +5 nm in both the x-direction and y-direction, as shown in FIG. 3C.

The shift analysis tool 635 will make selections, i.e., the first selection 140, the second selection 140', the third selection 140'' and the fourth selection 140''', to compare and measure offset values between the dummy features 125 in the different layers 105, 110, 115, 120. For example, the shift analysis tool 635 can implement the first selection 140 and the second selection 140' so that the first layer 105 is compared to the fourth layer 120. Specifically, the dummy features 125' in the first layer 105 are compared with respect to the dummy features 125'''' of the fourth layer 120. The shift analysis tool 635 will use a measuring technique, e.g., an SEMOVL technique, to measure the offset between the dummy features 125' and the dummy features 125''''. The shift analysis tool 635 will continue to make subsequent selections, a third selection 140'' and a fourth selection 140''', to collect sufficient offset data with respect to the dummy features 125, i.e., dummy features 125', 125'', 125''', 125''''.

The shift analysis tool 635 will take the measurements collected during the first selection 140, the second selection 140', the third selection 140'' and the fourth selection 140''', and plug these values into a function, e.g., the measurements 142, 142', 142'' are entered as variables "a", "b", "c" into the function (5), to determine an output value. In alternative processes, the shift analysis tool 635 can locate a first plurality of offset dummy features in a first layer, i.e., the dummy features 125' of the first layer 105, and also locate a second plurality of offset dummy features in a second layer, i.e., the dummy features 125'' of the second layer 110. The shift analysis tool 635 will measure a distance, e.g., measurements 142, between the first plurality of offset dummy features 125' and the second plurality of offset dummy features 125''. Based on these measurements and subsequent measurements, e.g., 142', 142'' from further selections, the shift analysis tool 635 can determine that the first layer 105 or the second layer 110 is shifted with respect to one another based on the measurement. More specifically, the shift analysis tool 635 will compare the output value of the various measurements to a known value which represents no undesired overlay shift. If the output value equals the known value, the shift analysis tool 635 determines that no shift is present in the layers of the structure 200. Alternatively, if the output value does not equal the known value, the shift analysis tool 635 determines that a shift is present in at least one of the layers of the structure 200, i.e., layers 105, 110, 115, 120.

The shift analysis tool 635 will continue once a determination has been made that an undesired shift is present in the structure 200. Specifically, the shift analysis tool 635 will analyze the layers which are suspected to be shifted. As an example, if the first layer 105 is suspected of being shifted, the shift analysis tool 635 will measure a distance 150 between the dummy features 125' of the first layer 105 by implementing a measurement technique, e.g., SEMOVL. The shift analysis tool 635 will compare the distance 150 to a known distance value. If the distance 150 equals the known distance value, then the shift analysis tool 635 renders a determination that no shift is present in this layer, i.e., the first layer 105. Alternatively, if the distance 150 does not equal the known distance value, then the shift analysis tool 635 renders a determination that a shift is present in this layer, i.e., the first layer 105. The shift analysis tool 635 can perform further analysis of other layers which are suspected of being shifted to determine if more than one layer in the structure 200 is shifted.

Although the systems and methods described hereafter are with regard to exemplary methods, and/or computer program products, it should be understood that other implementations are also contemplated by the present disclosure as described herein. For example, other devices, systems, appliances, and/or computer program products according to embodiments of the present disclosure will be or become apparent to one of ordinary skill in the art upon review of the drawings and detailed description. It is intended that all such additional other devices, systems, appliances, processes, and/or computer program products be included within the scope of the present disclosure.

The circuits of the present disclosure can be manufactured in a number of ways using a number of different tools. In general, though, the methodologies and tools are used to form circuits with dimensions in the micrometer and nanometer scale. The methodologies, i.e., technologies, employed to manufacture the structure of the present disclosure have been adopted from integrated circuit (IC) technology. For example, the circuits are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    locating a first plurality of offset dummy features in a first layer;
    locating a second plurality of offset dummy features in a second layer;
    measuring a distance between each offset dummy feature of the first plurality of offset dummy features in the first layer with respect to one another and each offset dummy feature of the second plurality of offset dummy features in the second layer with respect to one another; and
    determining that the first layer or the second layer is shifted with respect to one another by comparing the measurement from the first layer or the second layer to a known value.

2. The method of claim 1, wherein the first plurality of offset dummy features and the second plurality of offset dummy features are dummy interconnect structures.

3. The method of claim 1, wherein the first plurality of offset dummy features and the second plurality of offset dummy features are offset in an x-direction.

4. The method of claim 1, wherein the first plurality of offset dummy features and the second plurality of offset dummy features are offset in a y-direction.

5. The method of claim 1, wherein the measuring the distance comprises measuring across a surface of the second layer.

6. The method of claim 1, wherein the first plurality of offset dummy features and the second plurality of offset dummy features are located in unused space in the first layer and the second layer.

7. The method of claim 6, wherein the unused space in the first layer and the unused space in the second layer maintains the integrity of the first plurality of offset dummy features and the second plurality of offset dummy features during a dicing process.

8. The method of claim 7, wherein the first plurality of offset dummy features are different structures than the second plurality of offset dummy features.

9. The method of claim 8, wherein the first plurality of offset dummy features are interconnect structures.

10. The method of claim 9, wherein the second plurality of offset dummy features are gate structures.

11. The method of claim 10, wherein the first plurality of offset dummy features are negatively offset.

12. The method of claim 11, wherein the second plurality of offset dummy features are positively offset.

13. The method of claim 12, wherein the measuring the distance for the first layer comprises measuring across a surface of the first layer.

14. The method of claim 13, wherein the measuring across the surface of the first layer is implemented by a scanning electron microscope overlay technique.

* * * * *